United States Patent
Duane et al.

(10) Patent No.: US 6,329,695 B1
(45) Date of Patent: *Dec. 11, 2001

(54) MERGED SIDEWALL SPACER FORMED BETWEEN SERIES-CONNECTED MOSFETS FOR IMPROVED INTEGRATED CIRCUIT OPERATION

(75) Inventors: Michael P. Duane, Austin, TX (US); Steven E. Bourland, W. Lafayette, IN (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,515

(22) Filed: Jan. 6, 1999

(51) Int. Cl.[7] .......................... H01L 29/76; H01L 27/088
(52) U.S. Cl. ........................... 257/408; 257/413; 257/900
(58) Field of Search ................................ 257/408, 401, 257/389, 333, 336, 337, 412, 413, 900, 758, 776; 438/303, 184, 230, 265, 595

(56) References Cited

U.S. PATENT DOCUMENTS

| | | | |
|---|---|---|---|
| 5,616,959 | * 4/1997 | Jeng | 257/758 |
| 5,710,061 | * 1/1998 | Cleeves | 438/618 |
| 5,717,251 | * 2/1998 | Hayashi et al. | 257/758 |
| 5,811,862 | * 9/1998 | Okugaki et al. | 257/390 |
| 6,174,803 | * 1/2001 | Harvey | 438/638 |

FOREIGN PATENT DOCUMENTS 406232407    8/1994  (JP).

* cited by examiner

Primary Examiner—Steven Loke
Assistant Examiner—Hung Kim Vu
(74) Attorney, Agent, or Firm—Kevin L. Daffer; Conley, Rose & Tayon P.C.

(57) ABSTRACT

An improved series-connected transistor architecture and a method for forming the same are provided. Gate conductors for series connected transistors are patterned such that gate conductors on either side of a merged source/drain region which will not be contacted in the completed circuit are spaced more closely together than other gate conductors. In an embodiment of the method, these closely-spaced gate conductors have a spacing between facing sidewalls of less than about twice the expected sidewall spacer width for the process. After a first dopant impurity introduction, a conformal dielectric layer is deposited and portions of the dielectric layer are removed to form sidewall spacers. In the region between the closely-spaced gate conductors, the spacers are merged to form a continuous dielectric. This dielectric protects the substrate between the closely-spaced gate conductors from subsequent impurity introduction and salicide processes. In an alternate embodiment, dielectrics are formed between and adjacent to all gate conductors using dielectric deposition and chemical-mechanical polishing. All dielectrics except those between the closely-spaced gate conductors are subsequently removed, and spacers are formed on exposed sidewalls of the gate conductors.

6 Claims, 6 Drawing Sheets

MERGED SIDEWALL SPACER FORMED BETWEEN SERIES-CONNECTED MOSFETS FOR IMPROVED INTEGRATED CIRCUIT OPERATION

BACKGROUND OF THE INVENTION

1. Field of the Invention

This invention relates to integrated circuit fabrication and, more particularly, to an improved series-connected transistor architecture and method for producing this architecture by forming merged sidewall spacers.

2. Description of the Relevant Art

In integrated circuit fabrication, transistors are fabricated upon and within a semiconductor substrate, and subsequently interconnected to form circuits. In digital metal-oxide-semiconductor (MOS) integrated circuit fabrication, for example, MOS field-effect transistors (MOSFETs) are typically connected into circuits which perform logical operations, such as AND and OR functions. An example of an n-type MOS (NMOS) circuit which performs an inverting AND, or NAND, operation is shown in FIG. 1. Transistor 10 has its source connected to ground, its gate connected to input voltage A, and its drain connected to the source of transistor 12. The gate of transistor 12 is in turn connected to input voltage B, and the drain of transistor 12 is connected to the source of load transistor 14. Output voltage $V_0$ is taken at the drain of transistor 12.

A partial cross-sectional view of the transistors of FIG. 1 formed upon and within semiconductor substrate 16 is shown in FIG. 2. Because transistors 10, 12, and 14 are connected in series, with the drain of one connecting to the source of another, it is important not to form isolation regions between them. Isolation regions 18 are therefore arranged only at the outside of the group of transistors. To fabricate the transistors of FIG. 2, a gate dielectric layer is formed on substrate 16, and a layer of a conductive material is subsequently deposited. These layers are subsequently patterned to form gate dielectrics 20 and gate conductors 22. A dielectric layer is subsequently deposited over the substrate and anisotropically etched to form dielectric spacers 24 on sidewalls of gate conductors 22. Before spacer formation, an impurity distribution may be introduced into substrate 16, self-aligned to sidewalls of gate conductors 22. Subsequent to spacer formation, a somewhat more heavily-doped impurity distribution may be introduced, self-aligned to exposed lateral surfaces of spacers 24. These two impurity distributions combine to form drain region 26 of transistor 14, merged source/drain regions 28, and source region 30 of transistor 10. Formation of spacers 24 may be advantageous for many reasons including the ability to form shallow lightly-doped drain (LDD) regions under the spacers which may lower the maximum electric field developed at the drain end of the channel. This lowered electric field may reduce the severity of hot-carrier effects such as avalanche breakdown at the drain/substrate junction and injection of carriers into the gate dielectric.

Spacers 24 may also be advantageous by providing isolation between the source/drain and gate regions so that a salicide process may be performed. In a salicide process, a metal film is blanket-deposited over the exposed surfaces of the transistor after formation of the source and drain regions. The transistor is then subjected to a heating process which causes a reaction between the metal and silicon that the metal is in contact with, forming a silicide on the silicon surfaces. Unreacted metal is then removed, leaving the silicide covering the gate, source, and drain regions. In forming the transistors shown in FIG. 2, a salicide process may be used to form gate silicides 32, drain silicide 34, merged source/drain silicides 36, and source silicide 38.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0 $\mu$m critical dimension. As feature size decreases, the resulting transistor size as well as the spacing between transistors also decreases. Fabrication of smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers regularly consider the benefits of electron beam lithography and x-ray lithography to achieve the lower resolutions needed for submicron features. To some extent, wet etching has given way to a more advanced anisotropic (dry etch) technique. Furthermore, silicides have replaced higher resistivity contact structures mostly due to the lower resistivity needed when a smaller contact area is encountered.

In addition to the processing techniques used, the layout of the specific circuits being fabricated may have an effect on the circuit density. This is illustrated by FIGS. 1 and 2, which show, for example, that transistors which are connected in series can be spaced more closely than those which must be separated by isolation regions. The density of the series-connected transistors is still limited, however, both by the space needed between gate conductors to accommodate sidewall spacers and by the space needed to form source/drain silicide contacts. It would therefore be desirable to develop a method for increasing the density of series-connected transistors.

SUMMARY OF THE INVENTION

The problems outlined above are in large part addressed by reducing the spacing between gate conductors of series-connected transistors for which no contact is made to the merged series source/drain (SSD) region. Isolation regions may be formed in a semiconductor substrate to define active regions such that each group of series-connected transistors shares an active region. Gate dielectric and conductive layers are subsequently formed on the semiconductor substrate. The conductive layer is patterned in such a way that gate conductors on either side of a merged SSD region are spaced closer together than gate conductors on either side of a series-connected source/drain region having a contact. In an embodiment of the method and resulting series transistor architecture, the spacing between facing sidewalls of the more closely spaced gate conductors is smaller than about twice the anticipated sidewall spacer width.

After patterning of the gate conductors, a shallow impurity distribution is introduced into the substrate, masked by the gate conductors. A conformal dielectric layer is subsequently blanket-deposited over the substrate and gate conductors. The conformal dielectric layer is then anisotropically etched so that conventional dielectric spacers are formed on sidewalls of the more widely spaced gate conductors. In the case of the closely spaced gate conductors, however, the spacers in the region between these closely spaced conductors are merged, such that a continuous dielectric region is formed. This occurs as a result of the small spacing between these conductors.

After the spacer formation, a deeper, somewhat more heavily doped impurity distribution may be introduced, masked by the gate conductors and dielectric spacers. For the more widely spaced gate conductors, this second impurity distribution combines with the distribution introduced before spacer formation to form source and drain regions having shallow "LDD" portions under the spacers. In the case of the closely spaced gate conductors, the continuous dielectric between these conductors prevents introduction of the second, deeper impurity distribution between the conductors. The merged SSD region between the more closely spaced gate conductors is therefore formed using only the first, shallow impurity introduction. A major reason for including a deeper, somewhat more heavily doped source or drain portion is believed to be formation of a low-resistance contact to the region. In particular, a silicide contact, which consumes some of the underlying silicon, is often formed over such deep source/drain portions. Because contact is not made to the merged SSD regions between the more closely spaced gate conductors, the deeper portions of these regions are not believed to be necessary. Furthermore, since the spacing is reduced, series resistance between channels will not substantially increase even though somewhat lighter doping is used in the merged SSD regions.

A salicide process may subsequently be performed on the substrate. In other words, a layer of metal may be blanket-deposited over the substrate. The substrate is then heated so that the metal reacts with any silicon which is in contact with it. Unreacted metal is subsequently removed, leaving silicide regions on upper surfaces of the gate conductors and the exposed source, drain, and SSD regions. No silicide is formed on the SSD regions between the closely spaced gate conductors, since these regions are covered by dielectric.

In an alternate embodiment of the method recited herein, a chemical-mechanical polishing (CMP) process may be performed after deposition of the conformal dielectric layer, such that dielectrics are formed adjacent to the gate conductor sidewalls, and upper surfaces of these dielectrics are at the same level as upper surfaces of the gate conductors. A layer of photoresist is subsequently deposited and patterned, such that photoresist masks are formed over the dielectrics between the closely-spaced gate conductors. An anisotropic etch process is subsequently employed to remove the dielectrics which are not covered by photoresist masks. The photoresist masks are subsequently removed, and another conformal dielectric layer is blanket-deposited over the gate conductors, substrate, and remaining dielectric regions. An anisotropic etch is subsequently performed such that conventional dielectric spacers are formed on exposed gate conductor sidewalls. This embodiment is believed to ensure a uniform thickness of the continuous dielectric formed between the more closely spaced gate conductors. In addition, a continuous dielectric may be formed in this manner between these closely spaced gate conductors without the constraint that the gate conductor spacing be made smaller than approximately twice the expected spacer width. This embodiment is also believed to allow formation of the dielectric between the closely spaced gate conductors from a different material than that used to form the conventional sidewall spacers in the circuit. Furthermore, the dielectric between the closely spaced gate conductors may be formed from a dielectric material which does not deposit conformally over the gate conductors.

In another alternative embodiment, a CMP planarization process is performed after deposition of the conformal dielectric layer, as described above. A salicide process is subsequently performed, such that gate silicides are formed. Spacers, deep S/D implants, and S/D silicides are not formed, so that the transistor fabrication process is simplified significantly.

The merged spacer formation over non-contacted SSD regions described above is believed to enhance circuit performance in several ways. Perhaps the most apparent enhancement is the reduced packing density of transistors which is achieved. The spacing of gate conductors on either side of merged SSD regions is typically limited by the widths of sidewall spacers and silicide contact regions, as noted above. Although control over conventional spacer formation processes is continually improving, spacer widths typically have a lower limit in a range from about 0.05 micron to about 0.1 micron. Larger silicide region widths are desirable in order to achieve large-area, low-resistance contacts to the underlying source or drain regions. Typical silicide region widths are currently on the order of 0.1 micron or larger. Therefore, the spacing between facing sidewalls of gate conductors of series transistors is typically at least 0.2 to 0.3 micron. For transistors fabricated using the method recited herein, however, the most significant factor limiting spacing of gate conductors on either side of a non-contacted SSD region is believed to be lithography resolution. It is postulated that lithographic technology is capable of producing gate conductor spacings at least as small as the widths of the gate conductors themselves. Since current gate conductor widths are approaching 0.15 micron, it is believed that spacings of about 0.15 micron or less are currently achievable for gate conductors on either side of non-contacted SSD regions.

Furthermore, the merged spacer formation recited herein is believed to reduce short-channel effects in the series-connected transistors. This reduction of short-channel effects is believed to arise from the absence of a deep S/D implant below the merged spacer. The resulting reduced junction depth of the merged SSD region under the merged spacer reduces encroachment of the depletion region associated with this SSD region into the channels of the series-connected transistors. Encroachment of S/D depletion regions into a transistor channel is related to short-channel effects, such as threshold voltage reduction and punchthrough, which cause increased subthreshold current. Use of the shallower merged SSD region recited herein is believed to allow series-connected transistors to be fabricated with shorter gate lengths, while maintaining subthreshold current levels comparable to those of longer-channel devices having conventional deep S/D regions. The shorter gate lengths of these series connected transistors are believed to result in higher drive currents and greater speed of the transistors.

In addition to allowing increased transistor density and reduced short-channel effects, the method and transistor architecture recited herein are believed to result in a lowered parasitic capacitance between the shortened SSD regions and the substrate. The substrate (or well region, for transistors fabricated in a well) in an MOS IC is often connected to the most negative voltage in the circuit if p-type, or the most positive voltage in the circuit if n-type. In this way, all p-n junctions formed between the substrate and S/D regions will be reverse-biased and pass negligible current. A parasitic junction capacitance is associated with each of these reverse-biased junctions. The junction capacitances are detrimental in that they increase the RC time constant associated with signal propagation in the circuit, and thereby reduce the speed at which reliable operation can be maintained. Because junction capacitance is proportional to junction area, the method recited herein is believed to lower parasitic capacitances associated with the non-contacted SSD regions. This lowered parasitic capacitance is believed to increase the achievable speed of the circuit.

The method and transistor architecture recited herein may also result in a reduction in hot-carrier effects for transistors having drains covered by the merged-spacer dielectrics described above. This reduction in hot-carrier effects may result from the absence of the somewhat more heavily doped portion of the SSD region. Although a conventional source or drain region typically contains a shallow LDD portion which helps to reduce the electric field at the drain end of the channel, the neighboring more heavily doped portion still contributes to the electric field in the channel. The absence of the more heavily doped portion may therefore cause the electric field at the drain end of the channel to be lower than that in a transistor with a traditional LDD drain configuration. The absence of the more heavily doped distribution and the silicide region may have the detrimental effect of increasing the resistivity of the SSD region. The effect of this increased resistivity on the series resistance of the region, however, is believed to be small. First of all, the shortening of the SSD region caused by the closer spacing of the gate conductors may cause a reduction in series resistance. Secondly, the impurity concentration in conventional LDD impurity distributions is believed to have increased in recent years such that the LDD impurity concentration is typically within one order of magnitude of that of the more heavily-doped source or drain portions. Therefore, the actual resistivity increase is believed to be relatively small.

The method and transistor architecture recited herein are believed to be applicable to any IC which contains non-contacted merged SSD regions. Such SSD regions may be commonly found in many IC technologies, including NMOS, PMOS, CMOS, and BiCMOS.

BRIEF DESCRIPTION OF THE DRAWINGS

Other objects and advantages of the invention will become apparent upon reading the following detailed description and upon reference to the accompanying drawings in which.

Figure 1:
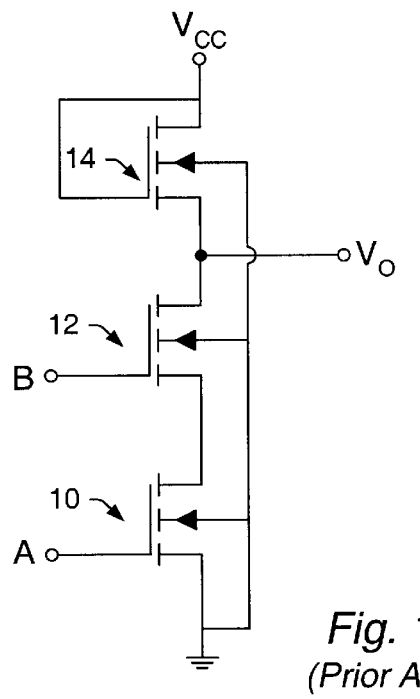
FIG. 1 is a circuit schematic of an NMOS NAND gate with an enhancement NMOS load.
Figure 2:
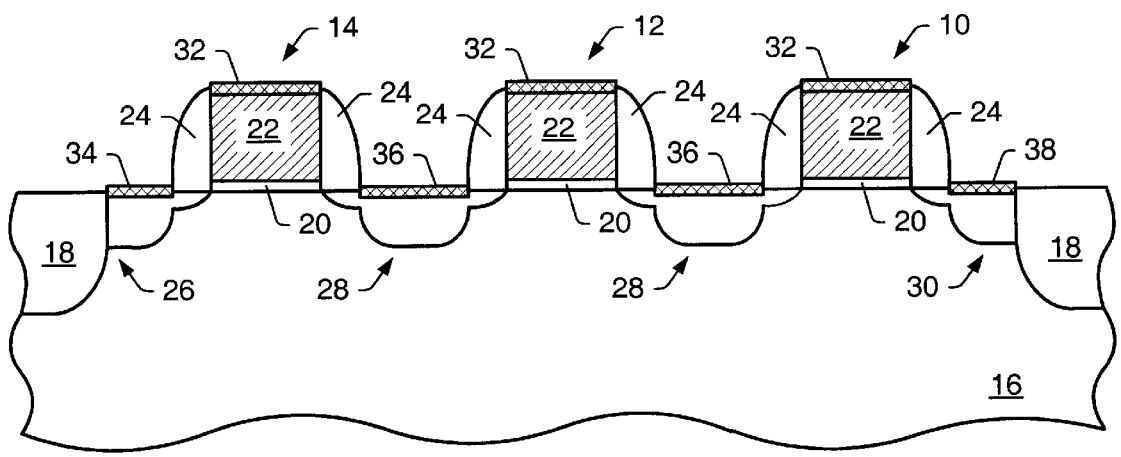
FIG. 2 is a partial cross-sectional view of a semiconductor topography including series-connected NMOS transistors which may be used to form the NAND gate of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 3:
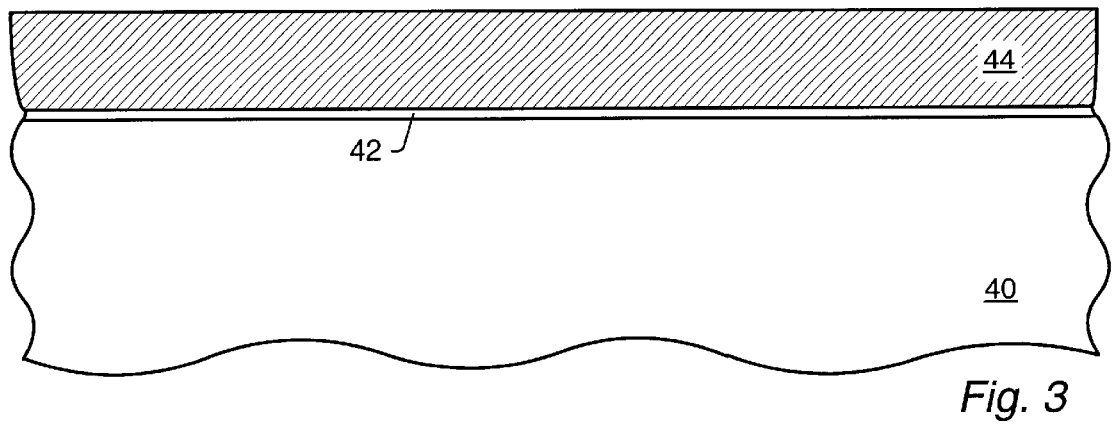
FIG. 3 is a partial cross-sectional view of a semiconductor topography according to the method recited herein, including a dielectric layer and conducting layer deposited upon a semiconductor substrate.

Turning to the drawings, FIG. 3 illustrates a partial cross-section of a semiconductor topography including a dielectric layer 42 and conductive layer 44 deposited over a semiconductor substrate 40. Semiconductor substrate 40 is preferably silicon, and is doped either n-type (for producing a p-channel transistor) or p-type (for an n-channel transistor). More specifically, substrate 40 may be an epitaxial silicon layer grown on a monocrystalline silicon substrate, or an n-type or p-type well region formed in a monocrystalline silicon substrate. Dielectric layer 42 is preferably thermally grown silicon dioxide, which may be grown by heating the substrate to a temperature of greater than about 700° C. in an oxidizing ambient such as $O_2$ or $H_2O$. Other dielectrics may be used, however, including silicon nitride, silicon oxynitride or nitrided silicon dioxide. Dielectric layer 42 may also include deposited $SiO_2$. Conductive layer 44 is preferably a polysilicon layer or any conductive (or to be rendered conductive) material capable of withstanding high temperature cycles. A polysilicon layer for conductive layer 44 may be deposited using chemical vapor deposition (CVD) of silicon from, for example, a silane source. Such a CVD process may alternatively result in an amorphous silicon layer, particularly if low substrate temperatures are used. Conductive layer 44 may be formed from such an amorphous silicon layer, or other conductive materials which can withstand subsequent processing (such as that needed to form transistor source and drain regions) may also be used.

Figure 4:
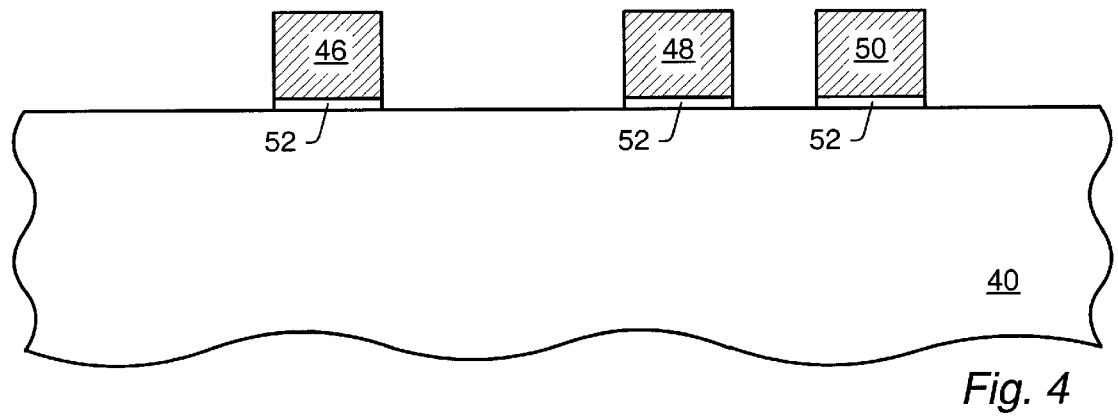
FIG. 4 is a partial cross-sectional view of the semiconductor topography, wherein the dielectric and conducting layers are patterned to form gate conductors over gate dielectrics, subsequent to the depositions of FIG. 3.

Dielectric layer 42 and conductive layer 44 are subsequently patterned to form gate conductors 46, 48, and 50 over gate dielectrics 52, as shown in FIG. 4. The patterning is performed using lithography and etching techniques well-known in the art. Alternatively, dielectric layer 42 may be left unpatterned so that upper surfaces of substrate 40 are protected during subsequent processing. Appropriate portions of dielectric layer 42 would then be removed prior to making contact to upper surfaces of substrate 40. Gate conductors 46, 48 and 50 are to be used to form a series-connected transistor circuit. Using knowledge of the ultimate circuit configuration, gate conductors 48 and 50 are spaced more closely together than gate conductors 46 and 48. This is because contact is to be made to a merged SSD region to be formed between conductors 46 and 48, while no contact is to be made to a merged SSD region to be formed between conductors 48 and 50. An example of such a circuit is the NAND gate of FIG. 1, with transistors to be formed using gate conductors 46, 48, and 50 corresponding to transistors 14, 12, and 10 of FIG. 1, respectively. The minimum spacing between closely-spaced gate conductors 48 and 50 is believed to be set by lithographic limitations. A spacing at least as small as the smallest patterned gate length in the circuit is believed to be achievable. Although not shown, there may be dielectric isolation regions formed within substrate 40 and surrounding the group of gate conductors 46, 48, and 50. Because the transistors formed using gate conductors 46, 48 and 50 are to be connected in series, no isolation regions are formed between these gate conductors. Methods of forming the isolation regions may include dielectric deposition to fill trenches etched into the substrate and local oxidation of silicon.

Figure 5:
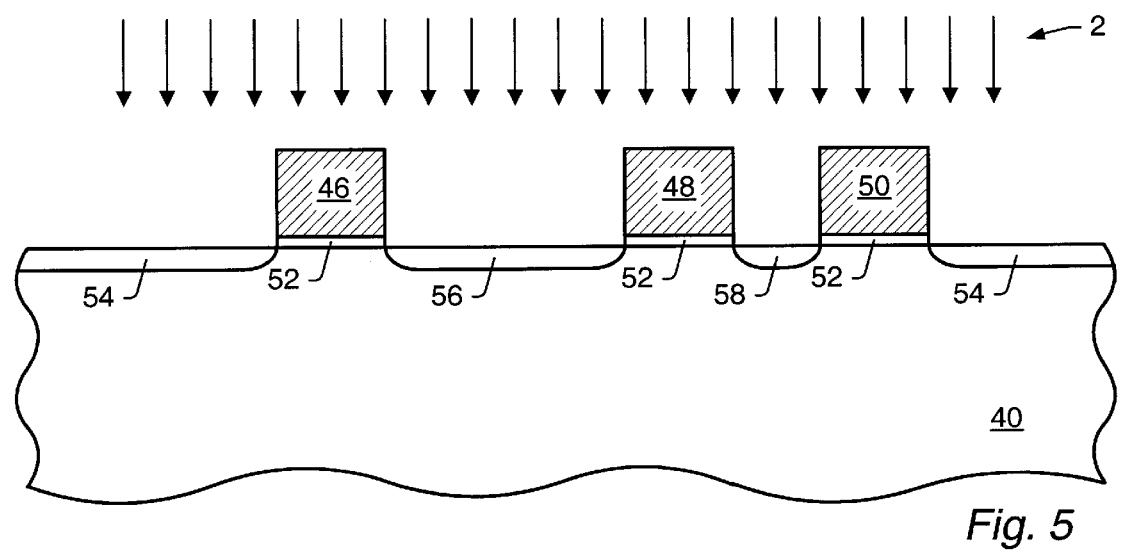
FIG. 5 is a partial cross-sectional view of the semiconductor topography, wherein a dopant impurity is introduced into the substrate, subsequent to the patterning of FIG. 4.

Dopant impurities may be introduced into substrate 40 using impurity introduction process 2, as shown in FIG. 5. Process 2 is preferably an ion implantation process, and the impurities introduced are of opposite type to that of substrate 40. To form an n-channel transistor, for example, substrate 40 is p-type and the dopant impurities introduced by process 2 are n-type. Typical n-type dopants include arsenic and phosphorus, while boron is a typical p-type dopant. Impurity introduction 2 results in the formation of source or drain impurity distributions 54, long merged SSD distribution 56, and short merged SSD region 58, all self-aligned to corresponding sidewalls of gate conductors 46, 48 and 50. The ion implantation dose of impurity introduction 2 may be as high as about $1 \times 10^{15}$ cm$^2$.

Figure 6:
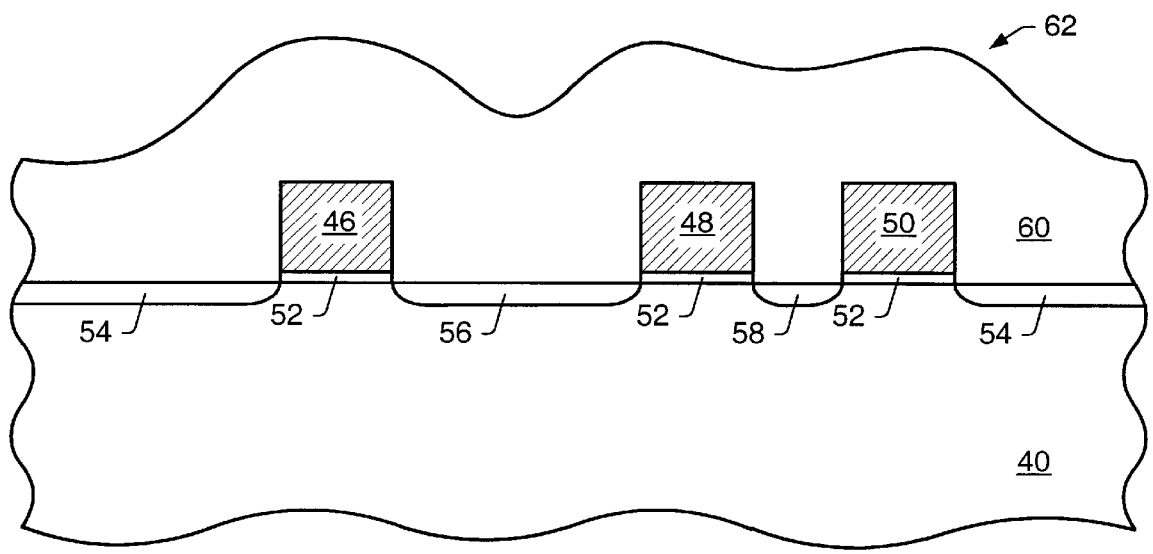
FIG. 6 is a partial cross-sectional view of the semiconductor topography, wherein a conformal dielectric layer is deposited across the topography, subsequent to the impurity introduction of FIG. 5.

Turning now to FIG. 6, conformal dielectric layer 60 is blanket deposited over substrate 40. Dielectric layer 60 is typically silicon dioxide deposited by CVD. In particular, decomposition of tetraethyl orthosilicate (TEOS) may be performed in a plasma-enhanced CVD (PECVD) reactor at a substrate temperature in the range from about 200° C. to about 500° C. to produce a very conformal film. Other techniques which may be used to deposit silicon dioxide for dielectric layer 60 include PECVD using a silane source, and atmospheric-pressure CVD (APCVD) and low-pressure CVD (LPCVD) using silane or TEOS sources. Dielectric layer 60 may also be formed from a different dielectric, such as silicon nitride or silicon oxynitride. In an alternative embodiment, dielectric 60 may be formed from a low-permittivity ("low-k") dielectric, generally known in the art as a dielectric having a dielectric constant of less than about 3.5. Use of a low-k dielectric may allow capacitive interaction between closely-spaced gate conductors such as 48 and 50 to be avoided. Low-k dielectric development is currently a very active area of semiconductor processing research. One low-k dielectric in current use which is believed to make a conformal film is fluorine-doped silicon dioxide.

Figure 7:
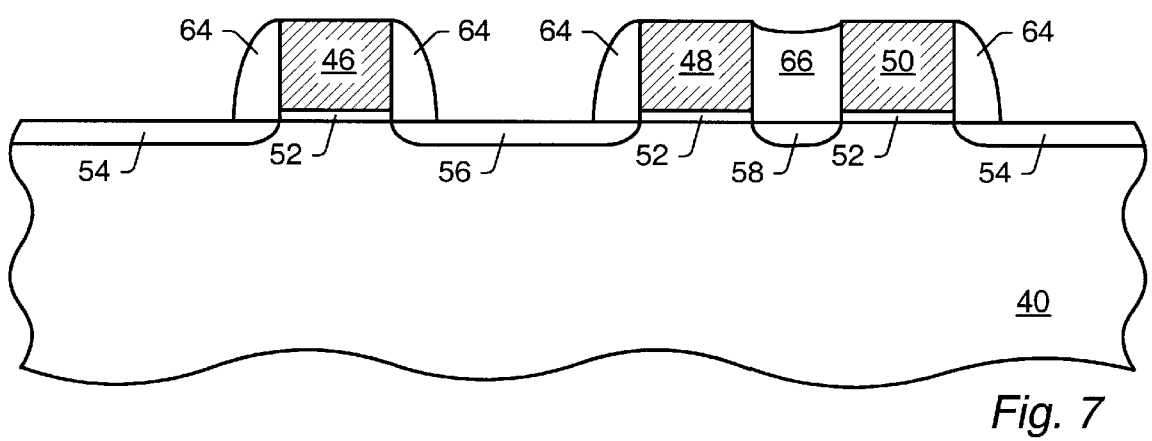
FIG. 7 is a partial cross-sectional view of the semiconductor topography, wherein a portion of the dielectric layer is removed to form a dielectric between facing sidewalls of the more closely spaced gate conductors and dielectric spacers adjacent to other gate conductor sidewalls, subsequent to the deposition of FIG. 6.

Dielectric layer 60 is thick enough that the trench formed by facing sidewalls of gate conductors 48 and 50 is completely filled with dielectric. Because of the close spacing of gate conductors 48 and 50, the "dip", if any, formed between conductors 48 and 50 in upper surface 62 of dielectric layer 60 is smaller than that formed between conductors 46 and 48. Portions of dielectric layer 60 are subsequently removed, as shown in FIG. 7. Dielectric spacers 64 are thereby formed on sidewalls of gate conductor 46, and on non-facing sidewalls of conductors 48 and 50. In addition to dielectric spacers 64, dielectric 66 is formed in the trench between facing sidewalls of gate conductors 48 and 50. The small spacing between conductors 48 and 50 (preferably less than twice the expected width of one of spacers 64), combined with surface smoothing which may occur when filling a narrow trench with a thick dielectric layer, is believed to ensure a contiguous dielectric between conductors 48 and 50. Dielectric 66 is a merged spacer covering merged SSD region 58. The selective removal of portions of dielectric layer 60 is preferably accomplished using an anisotropic etch process, typically an ion-assisted etching process, in which etching occurs more rapidly in a vertical direction than in a horizontal direction.

Figure 8:
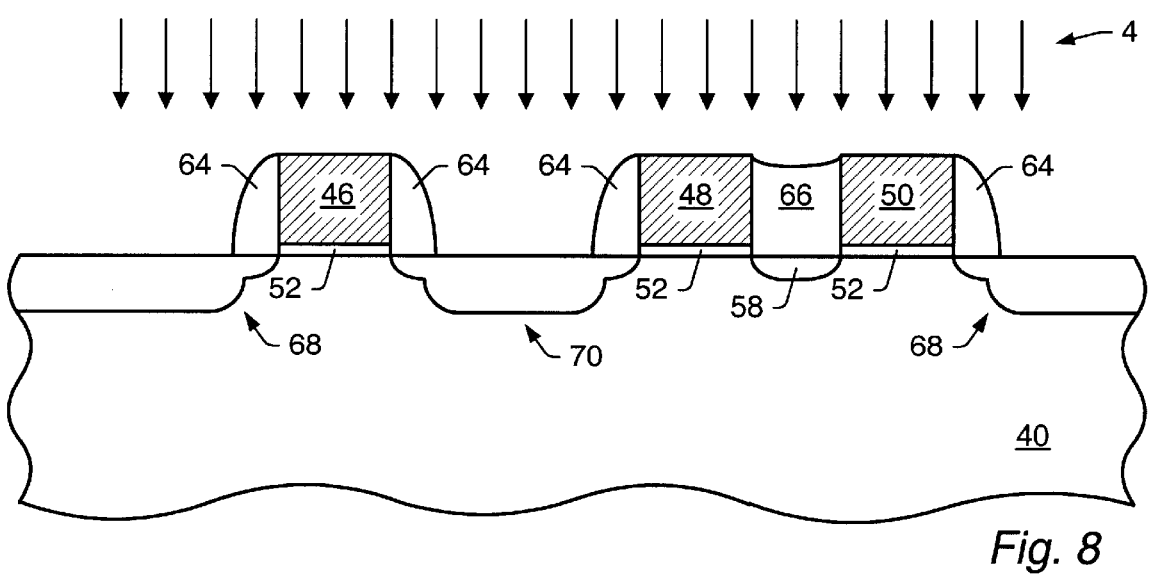
FIG. 8 is a partial cross-sectional view of the semiconductor topography, wherein a second dopant impurity is introduced into the substrate, subsequent to the dielectric and spacer formation of FIG. 7.

Subsequent to formation of spacers 64 and dielectric 66, dopant impurity introduction 4, preferably an ion implantation, may be performed, as shown in FIG. 8. Impurity introduction 4 is preferably self-aligned to exposed lateral sidewalls of spacers 64 to form impurity regions which are deeper and more heavily doped than those formed by impurity introduction 2 shown in FIG. 5. The impurities introduced by process 4 are of the same type as those introduced by process 2. The impurity distributions formed using processes 2 and 4 combine to form source or drain regions 68 and SSD region 70. These regions include comparatively lightly doped portions under spacers 64. The impurities introduced by process 4 are not included in SSD region 58, however, since they are blocked by dielectric 66.

Figure 9:
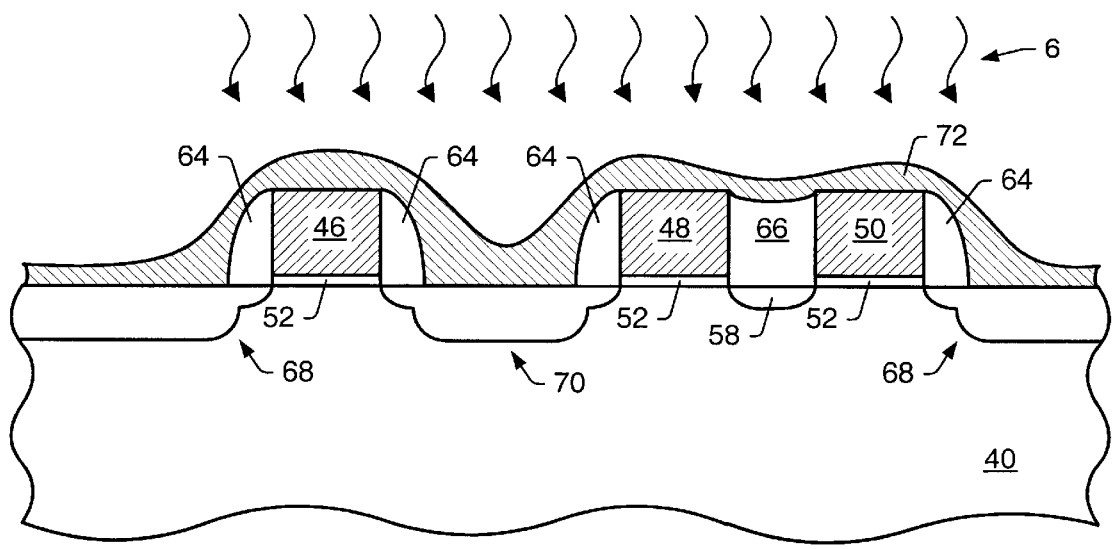
FIG. 9 is a partial cross-sectional view of the semiconductor topography, wherein a metal layer is deposited over the semiconductor substrate and reacted with underlying silicon using a thermal process, subsequent to the impurity introduction of FIG. 8.

Turning now to FIG. 9, metal layer 72 is blanket deposited over substrate 40, and reacted with underlying silicon using thermal process 6. Metal layer 72 is preferably formed from titanium or cobalt, but may include other metals with which silicides may be formed, such as platinum, tungsten, tantalum, palladium, or nickel. Thermal process 6 preferably includes heating the substrate to a temperature greater than about 600° C. in an inert ambient such as nitrogen, argon, or forming gas (nitrogen with 5% hydrogen). The heating may be performed in a rapid thermal annealing system or in a standard furnace. Portions of metal layer 72 which are in contact with silicon react with the silicon to form silicide.

Unreacted metal is subsequently removed, forming the transistors shown in FIG. 10. This removal is typically accomplished using a wet etch which is selective to the unreacted metal over silicide, silicon, and oxide. A suitable etch for unreacted titanium, for example, may be a 5:1:1 mixture of water, 30% hydrogen peroxide, and ammonium hydroxide. A suitable etch for unreacted cobalt may be a 3:1 mixture of hydrochloric acid and 30% hydrogen peroxide. Removal of unreacted portions of metal 72 leaves silicides 74 on upper surfaces of gate conductors 46, 48 and 50, source or drain regions 68, and SSD region 70. No silicide is formed over SSD region 58, because dielectric 66 prevents contact between this region and metal layer 72.

Figure 10:
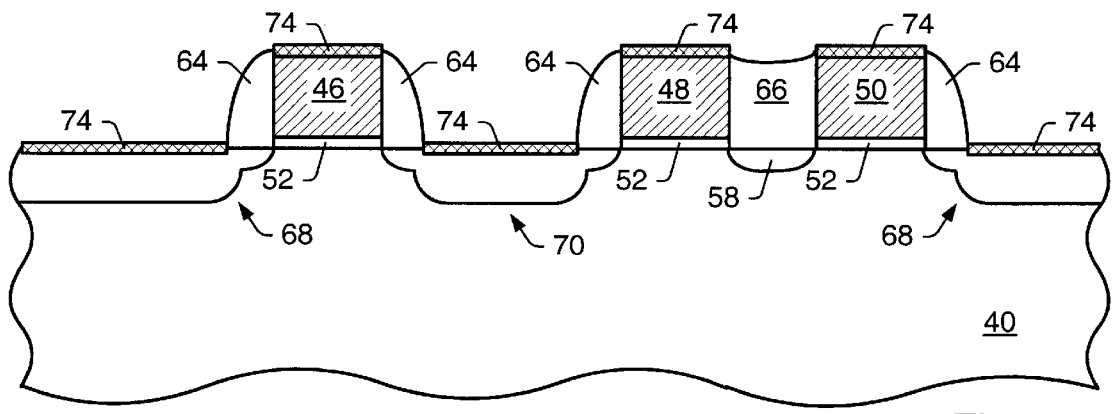
FIG. 10 is partial cross-sectional view of the semiconductor, wherein unreacted portions of the metal layer are removed, subsequent to the reaction of FIG. 9.

The series-connected transistor architecture shown in FIG. 10 is believed to allow a higher density of transistors in the circuit, since gate conductors 48 and 50 are more closely spaced than gate conductors in a conventional process. An effect which may be even more significant is the reduction of hot-carrier effects which is believed to occur for transistors having a more lightly-doped region such as SSD region 58 for a drain. For example, in a circuit embodiment for which the transistors containing gate conductors 46, 48 and 50 correspond to transistors 14, 12 and 10 of FIG. 1, transistor 10 would have SSD region 58 as a drain and would be expected to show reduced hot-carrier effects. Furthermore, shortened SSD regions such as 58 are believed to exhibit a reduced capacitance with respect to substrate 40 than conventional SSD regions such as 70, thereby increasing the speed of the circuit.

Figure 11:
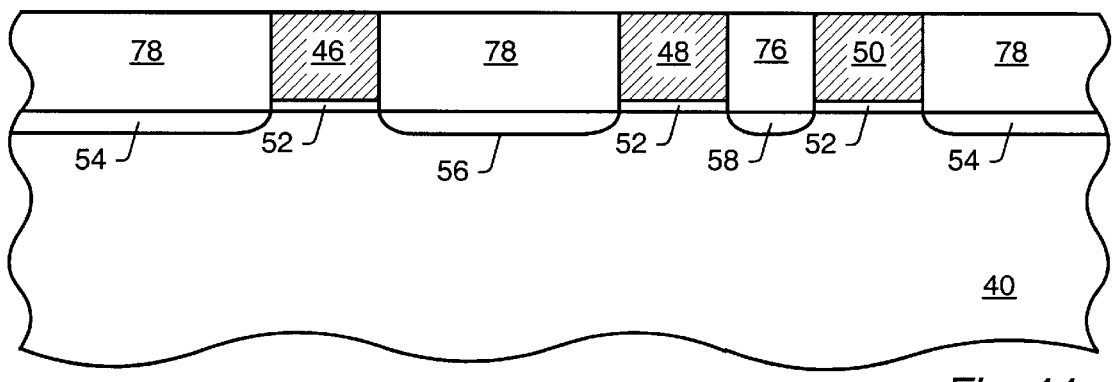
FIG. 11 is a partial cross-sectional view of the semiconductor topography in an alternative embodiment, wherein an upper portion of the dielectric layer is removed to form dielectrics adjacent to all gate conductor sidewalls, subsequent to the dielectric deposition of FIG. 6.

In an alternative embodiment of the method recited above, upper portions of dielectric layer 60 are removed such that dielectrics are formed between and adjacent to gate conductors 46, 48 and 50. Dielectric 76, formed between closely spaced conductors 48 and 50, and dielectrics 78, formed adjacent to sidewalls of conductor 46 and non-facing sidewalls of conductors 48 and 50, are shown in FIG. 11. Dielectrics 76 and 78 of FIG. 11 are formed from dielectric layer 60, shown in FIG. 6. Upper surfaces of dielectrics 76 and 78 are at the same elevation as upper surfaces of gate conductors 46, 48 and 50. Removal of upper portions of dielectric layer 60 is preferably achieved using chemical-mechanical polishing (CMP). Other methods, including reflow and etchback techniques, may also be used. Because spacers are not formed from dielectric layer 60 in the embodiment of FIG. 11, dielectric layer 60 does not need to be conformal with the underlying gate conductors, as long as it is thick enough that the regions between gate conductors are filled. A greater variety of materials and deposition conditions is therefore available for formation of dielectric layer 60. For example, in an embodiment for which dielectric 60 is made from a low-k material, as discussed in the description of FIG. 6 above, a low-k spin-on glass such as hydrogen-silsesquioxane may be suitable.

Figure 12:
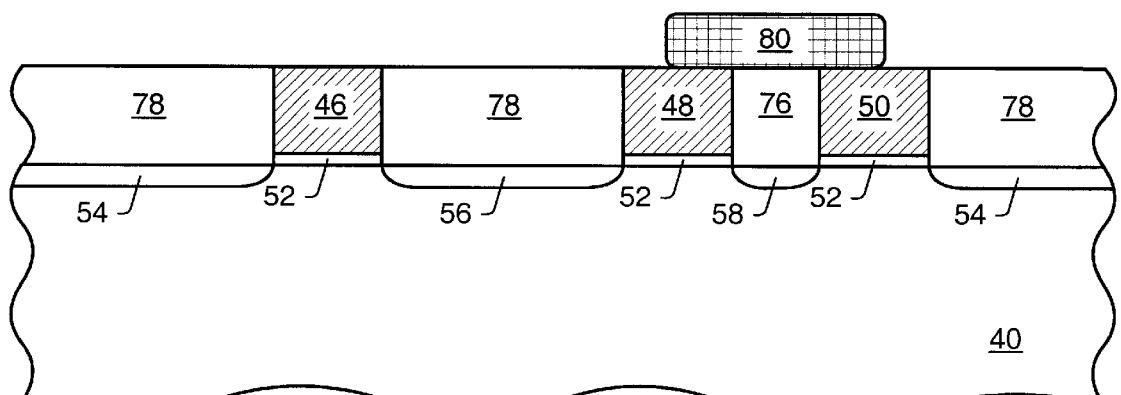
FIG. 12 is a partial cross-sectional view of the semiconductor topography, wherein a masking layer is formed over the dielectric between the more closely spaced gate conductors, subsequent to the dielectric portion removal of FIG. 11.
Figure 13:
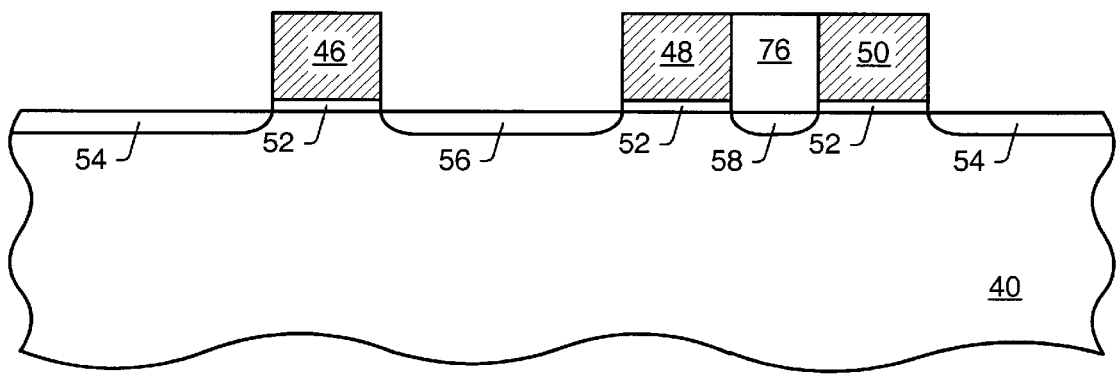
FIG. 13 is a partial cross-sectional view of the semiconductor topography, wherein exposed dielectrics are selectively removed and the masking layer is then removed, subsequent to the masking layer formation of FIG. 12.
Figure 14:
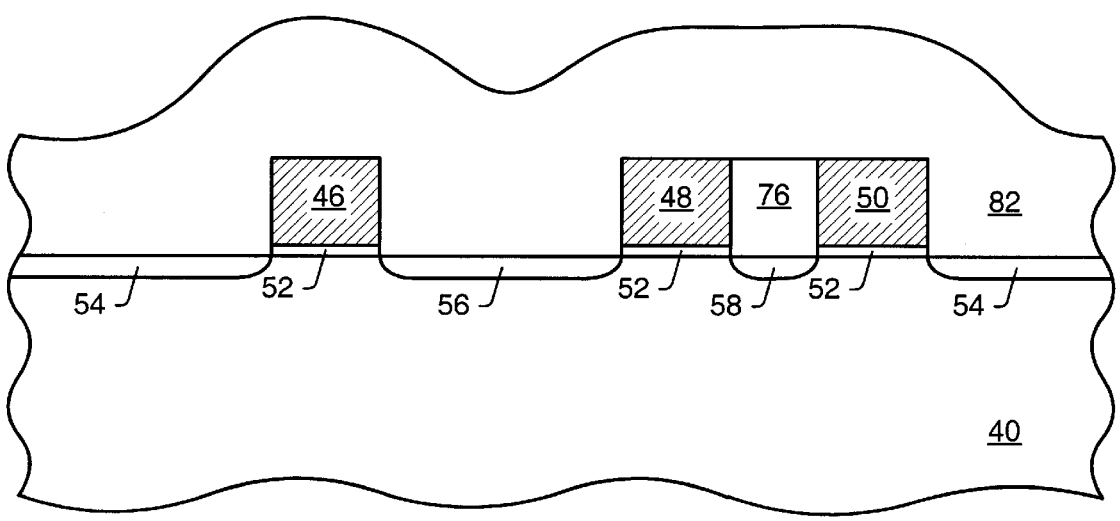
FIG. 14 is a partial cross-sectional view of the semiconductor topography, wherein a conformal dielectric layer is deposited over the topography, subsequent to the masking layer removal of FIG. 13.
Figure 15:
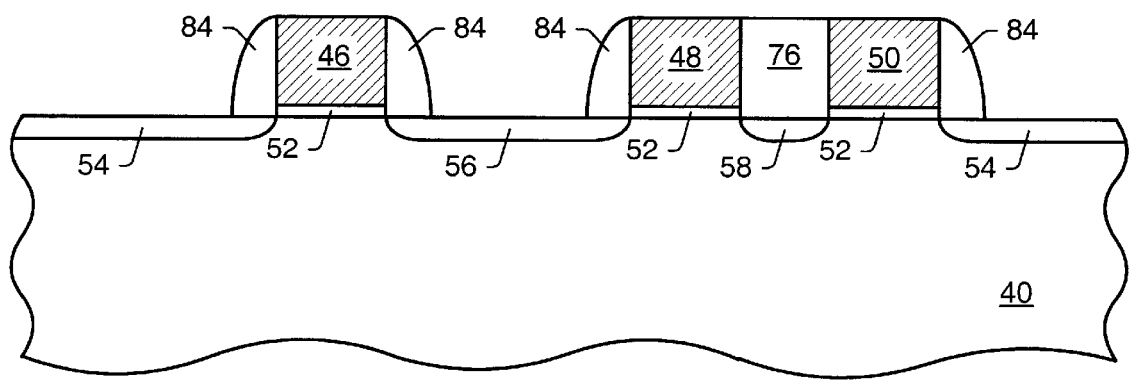
FIG. 15 is a partial cross-sectional view of the semiconductor topography, wherein portions of the dielectric layer are removed to form spacers on exposed sidewalls of the gate conductors, subsequent to the deposition of FIG. 14.

Turning now to FIG. 12, masking layer 80 is formed which covers dielectric 76 while exposing dielectrics 78. Masking layer 80 is preferably photoresist, which is applied and patterned using methods well-known in the art. Other materials suitable for protecting dielectric 76 during removal of dielectrics 78 may also be used for masking layer 80. Dielectrics 78 are subsequently removed, followed by removal of masking layer 80, as shown in FIG. 13. Dielectrics 78 are preferably removed using a dry etch process. As can be seen in FIG. 13, removal of dielectrics 78 leaves dielectric 76 filling the region between gate conductors 48 and 50. Conformal dielectric layer 82 is subsequently blanket deposited over substrate 40, as shown in FIG. 14. Dielectric layer 82 is similar in composition and is deposited in a similar way to dielectric 60 in FIG. 6. Portions of dielectric layer 82 are selectively removed to form spacers 84 on exposed sidewalls of gate conductors 46, 48 and 50, as shown in FIG. 15. As in the case of spacers 64 in FIG. 7, spacers 84 are preferably formed using an anisotropic etch process which etches more rapidly in a vertical than in a horizontal direction.

After formation of spacers 84 as shown in FIG. 15, series-connected transistor formation may be continued in a manner similar to that shown in FIGS. 8–10. The embodiment of FIGS. 11–15 is believed to produce a dielectric (76) which completely fills the region between closely spaced gate conductors 48 and 50. In the embodiment of FIG. 7, on the other hand, the profile of the upper surface of dielectric 66 is dependent on the profile of surface 62 of dielectric layer 60 before etching. The profile of surface 62 may in turn depend on factors such as the spacing between conductors 48 and 50 and the specific conditions under which dielectric layer 60 is deposited. Dielectric 66 shown in FIG. 7 may therefore not be of uniform thickness and may not completely fill the region between gate conductors 48 and 50. Use of the procedure shown in FIGS. 11–15 also removes the constraint that closely spaced gate conductors 48 and 50 have a spacing of less than about twice the expected spacer width. The embodiment of FIGS. 11–15 further allows dielectric 76 to be formed from a different dielectric material than spacers 84. Dielectric 76 may be formed from a low-k dielectric, for example, while spacers 84 are formed from silicon dioxide. Moreover, as noted above, this embodiment allows dielectric 76 to be formed from materials that do not necessarily deposit conformally over gate conductors 46, 48 and 50.

Figure 16:
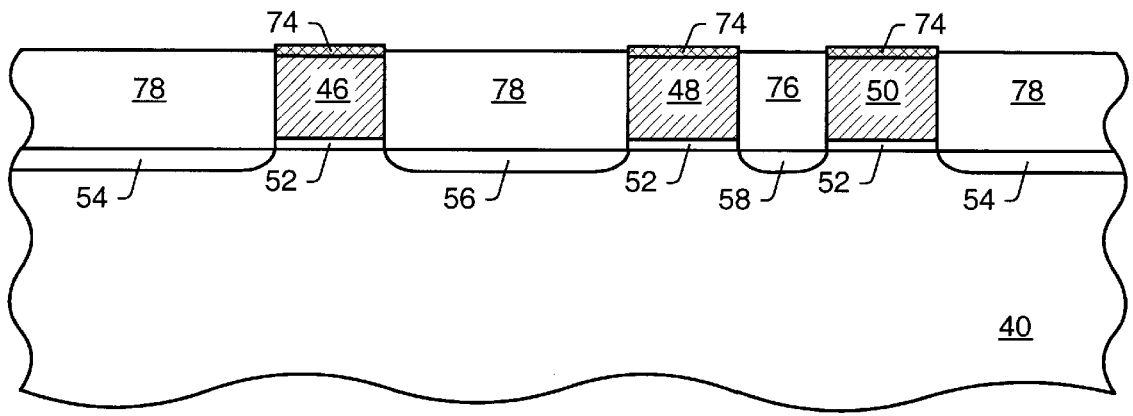
FIG. 16 is a partial cross-sectional view of the semiconductor topography in an alternative embodiment, wherein a gate salicide process is performed, subsequent to the dielectric portion removal of FIG. 11.

In another alternative embodiment shown in FIG. 16, gate silicides 74 are formed subsequent to the dielectric planarization shown in FIG. 11. No deep S/D implants are performed, and no spacers or S/D silicides are formed. The transistor fabrication process is thereby simplified significantly, at the price of possibly increased S/D contact resistances caused by the lack of S/D silicides. Openings may subsequently be formed in dielectrics 78 in order to make contact to source or drain impurity distributions 54 and long merged SSD distribution 56. Impurity distributions 54 and 56, though often called LDD distributions, are not significantly lower-doped than deeper impurity distributions such as distributions 68 and 70 of FIG. 8, as noted above. The series resistances of these source/drain regions, therefore, are not believed to be significantly increased. Because the main reason for using deep S/D implants is believed to be to prevent consumption of the S/D regions during silicide formation, the omission of S/D silicides in this embodiment may make the deep S/D implants unnecessary. In addition to simplification of the transistor fabrication process, the embodiment of FIG. 16 may result in decreased subthreshold current for the transistor including gate conductor 46. The shallow source and drain junction depths in this transistor are believed to result in less encroachment of source and drain depletion regions into the channel underlying gate conductor 46, thereby reducing short-channel effects which cause increased subthreshold current.

It will be appreciated to those skilled in the art having the benefit of this disclosure that this invention is believed to provide a method for forming an improved series-connected transistor architecture. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A series-connected transistor architecture, comprising:
   a pair of gate conductors dielectrically spaced over a semiconductor substrate such that facing sidewalls of the gate conductors form sidewalls of a trench between the gate conductors;
   a dielectric arranged upon the semiconductor substrate and within the trench;
   a pair of additional dielectrics arranged upon the semiconductor substrate adjacent to and in contact with a pair of opposing sidewalls, respectively, of the pair of gate conductors, wherein said additional dielectrics consist of a single dielectric material, wherein upper surfaces of the dielectric and the additional dielectrics are at substantially the same elevation level as upper surfaces of the pair of gate conductors, wherein at least one of the additional dielectrics extends to a sidewall of a respective additional gate conductor, and wherein a width of said at least one of the additional dielectrics is greater than a width of said dielectric; and
   merged source/drain regions arranged within the semiconductor substrate adjacent to and below each dielectric and additional dielectric, wherein at least one of the merged source/drain regions underlying at least one of said additional dielectrics underlies the entirety of the respective additional dielectric, and wherein the depth of a portion of each of the merged source/drain regions within the semiconductor substrate is substantially uniform and shallow.

2. The architecture as recited in claim 1, further comprising silicide regions upon upper surfaces of the gate conductors and additional gate conductor.

3. The architecture as recited in claim 1, wherein the dielectric and additional dielectrics comprise a low-permittivity dielectric.

4. The architecture as recited in claim 1, wherein said width of at least one of the additional dielectrics is greater than or equal to approximately twice the width of said dielectric.

5. The architecture as recited in claim 1, wherein said trench is completely filled with the dielectric.

6. The architecture as recited in claim 1, further comprising a conductive contact in contact with the substrate and arranged within said at least one of the additional dielectrics.

* * * * *